United States Patent [19]

Gollinger

[11] 4,097,771
[45] Jun. 27, 1978

[54] INTEGRATED CLOCK PULSE SHAPER

[75] Inventor: Wolfgang Gollinger, Voerstetten, Germany

[73] Assignee: ITT Industries, Incorporated, New York, N.Y.

[21] Appl. No.: 754,925

[22] Filed: Dec. 28, 1976

[30] Foreign Application Priority Data

Jan. 31, 1976 Germany .............................. 2603704

[51] Int. Cl.² ............................................... H03K 5/01
[52] U.S. Cl. .................................... 307/268; 307/269; 307/279
[58] Field of Search ............... 307/260, 261, 268, 269, 307/279, 291, 262, 251

[56] References Cited

U.S. PATENT DOCUMENTS 3,448,295 6/1969 Wanlass ................................. 307/260
3,660,827 5/1972 Tickle ................................. 307/279 X Primary Examiner—John Zazworsky
Attorney, Agent, or Firm—John T. O'Halloran; Peter C. Van Der Sluys

[57] ABSTRACT

An integrated clock pulse shaper showing a pair of resistivities each of which is connected in series to ground over the source drain line of one of a pair of MISFETs. The MISFETs are galvanically cross-coupled from the drain to the gate. A pair of overlapping pulse trains each of which is fed to one of the pair of resistivities, are shaped to a non-overlapping pair of pulse trains occurring at the common connection points of each transistor/resistivity pair.

2 Claims, 3 Drawing Figures

INTEGRATED CLOCK PULSE SHAPER

BACKGROUND OF THE INVENTION

This relates to a clock pulse shaper comprising cross-coupled MISFETs. In the fields of dynamic circuit engineering, especially in two-phase clocking, there are used MIScircuits, i.e. circuits employing insulated-gate field-effect transistors, the operation of which requires clock signals not overlapping one another. Relative thereto, reference is made to the book by D. Becker and H. Mader "Hochintegrierte MOS-Schaltungen", Stuttgart 1972, pp. 60 to 71.

SUMMARY OF THE INVENTION

It is the object of the invention to provide a clock pulse shaper easy to realize in accordance with MIS-techniques wherein the overlapping of two clock signal voltages used in multiphase engineering and the offset voltage of the clock signal voltages are brought to a minimum with respect to the reference potential.

Accordingly, the invention relates to an integrated clock pulse shaper employing insulated-gate field-effect transistors.

According to a broad aspect of the invention, there is provided an integrated clock pulse shaper for providing first and second non-overlapping clock signal voltages for use in multiphase clocked logic circuits, comprising: a first insulated-gate field effect transistor having source, drain and gate terminals; a second insulated-gate field effect transistor having source, drain and gate terminals, the drain terminal of each of said first and second transistors galvanically cross coupled to the gate terminals of said second and first transistor respectively; a first resistor; a second resistor; and means for applying first and second clock signal voltages to the source drain paths of said first and second transistors respectively via said first and second resistors, said first and second non-overlapping clock signal voltages appearing at the drain terminals of said first and second transistors respectively.

The above and other objects of the present invention will be more clearly understood from the following detailed description taken in conjunction with the accompanying drawings, in which:

DESCRIPTION OF THE PREFERRED EMBODIMENT

Figure 1:
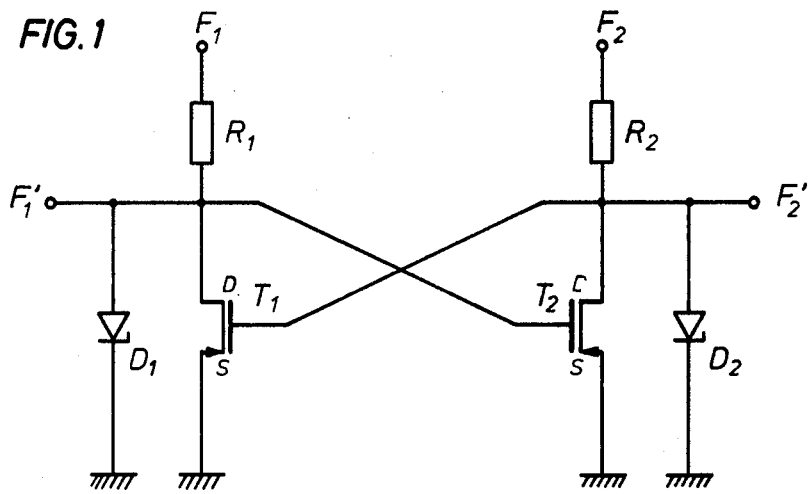
FIG. 1 is a circuit diagram of a preferred embodiment of the clock pulse shaper according to the invention.

The integrated clock pulse shaper according to the invention as shown in the circuit of FIG. 1 substantially contains two galvanically cross-coupled MIS field-effect transistors $T_1$ and $T_2$ manufactured in accordance with conventional MOS techniques. No special voltage supply is required. The drain terminals D of the two insulated-gate field-effect transistors $T_1$ and $T_2$ are each applied across one resistor $R_1$ and $R_2$, to the two clock pulse inputs $F_1$ and $F_2$. These two resistors $R_1$ and $R_2$, together with the two pn-diodes $D_1$ and $D_2$, each form a protective circuit for the gates of the following insulated-gate field-effect transistors applied to the two outputs $F_1'$ and $F_2'$. One terminal of the pn-diode $D_1$ is applied to the drain terminal of the first insulated-gate field-effect transistor $T_1$, in the same way, one terminal of the pn-diode $D_2$ is applied to the drain terminal of the second insulated-gate field-effect transistor $T_2$, the other terminals of the two pn-diodes $D_1$ and $D_2$ together with the source terminals S of the two insulated-gate field-effect transistors $T_1$ and $T_2$ are applied to a reference potential, in particular to the substrate potential. The terminals of the diodes are connected so that the diodes are reversely biased by the inputs $F_1$ and $F_2$.

The substantially non-overlapping clock pulse trains $F_1'$ and $F_2'$ are each taken as output signals off one of the two drain terminals D of the insulated-gate field-effect transistors $T_1$ and $T_2$.

Figure 2:
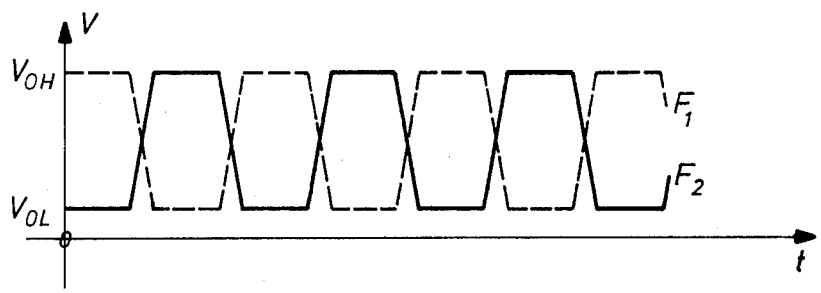
FIG. 2 shows the dependence with respect to time of two overlapping clock pulse trains and the position with respect to the reference potential at the input of the clock pulse shaper according to the invention.
Figure 3:
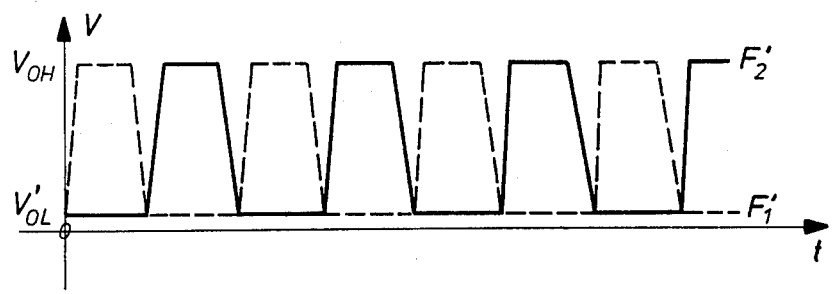
FIG. 3 shows the dependence with respect to time of the two clock pulse trains and the position with respect to the reference potential at the output of the integrated clock pulse shaper according to the invention.

FIG. 2 shows the dependence with respect to time of the input clock signal voltages $F_1$ and $F_2$ which partly overlap each other. At the output end, the output clock signal voltages $F_1'$ and $F_2'$ as shown in FIG. 3, which practically no longer overlap each other, are available.

The voltage $V_{OL}$ indicates the most positive clock signal voltage potential in the case of P-channel field-effect transistors or the most negative clock signal voltage potential in the case of N-channel field-effect transistors, or else also the offset voltage of the clock signal with respect to the reference potential. This amounts to about 1 volt in the case of conventional clock driver circuits, at the inputs $F_1$ and $F_2$. FIGS. 2 and 3 show that the value $V_{OL}$ of the clock signals is substantially reduced. In this way, $V_{OL}$ is smaller than the threshold voltage of the field effect transistors applied to $F_1'$ and $F_2'$, so that the latter are reliably blocked.

The power loss caused by transforming the clock signal voltages is very low because the current flow through the transistors $T_1$ and $T_2$ is restricted to the short time of overlapping of the clock signal voltages $F_1$ and $F_2$.

The arrangement according to FIG. 1 also increases the protective effect against static charging because only a fraction of the voltage simultaneously applied to $F_1$ and $F_2$ is permitted to reach the field-effect transistors to be protected.

Typical values for the resistors $R_1$ and $R_2$ are in the range between 1 and 2 k$\Omega$. The switch-on resistance $R_{on}$ of the two insulated-gate field-effect transistors $T_1$ and $T_2$ should have values ranging between 100 and 200 $\Omega$.

What is claimed is:

1. An integrated clock pulse shaper for providing first and second non-overlapping clock signal voltages for use in multiphase clocked logic circuits, comprising:
    a first insulated-gate field effect transistor having source, drain and gate terminals;
    a second insulated-gate field effect transistor having source, drain and gate terminals, the drain terminal of each of said first and second transistors galvanically cross coupled to the gate terminals of said second and first transistor respectively;
    a first resistor;
    a second resistor; and
    means for applying first and second clock signal voltages to the source drain paths of said first and second transistors respectively via said first and second resistors, said first and second non-overlapping clock signal voltages appearing at the drain terminals of said first and second transistors respectively.

2. An integrated clock pulse shaper according to claim 1 further including first and second reversely biased pn-diodes coupled between the drain terminals of said first and second transistors respectively and a reference potential.

* * * * *